US009453933B2

(12) United States Patent
Hua et al.

(10) Patent No.: US 9,453,933 B2
(45) Date of Patent: Sep. 27, 2016

(54) METHOD FOR DETERMINING THE POSITION OF A MOBILE UNIT AND INSTALLATION FOR EXECUTING A METHOD

(71) Applicant: SEW-EURODRIVE GMBH & CO. KG, Bruchsal (DE)

(72) Inventors: Zhidong Hua, Karlsruhe (DE); Andreas Wanjek, Waghäusel (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 14/403,415

(22) PCT Filed: May 13, 2013

(86) PCT No.: PCT/EP2013/001403
§ 371 (c)(1),
(2) Date: Nov. 24, 2014

(87) PCT Pub. No.: WO2013/174483
PCT Pub. Date: Nov. 28, 2013

(65) Prior Publication Data
US 2015/0185351 A1    Jul. 2, 2015

(30) Foreign Application Priority Data

May 22, 2012  (DE) .................. 10 2012 010 014

(51) Int. Cl.
*G01R 27/26* (2006.01)
*G01V 3/10* (2006.01)
*G01B 7/004* (2006.01)
*G01D 5/20* (2006.01)

(52) U.S. Cl.
CPC .............. *G01V 3/104* (2013.01); *G01B 7/004* (2013.01); *G01D 5/2086* (2013.01); *G01R 27/267* (2013.01); *G01R 27/2611* (2013.01); *G01R 27/26* (2013.01)

(58) Field of Classification Search
CPC .... G01B 7/004; G01D 5/2086; G01V 3/104; G01R 27/26; G01R 27/2611; G01R 27/267
USPC ........................................ 324/654, 649, 600
See application file for complete search history.

(56) References Cited

U.S. PATENT DOCUMENTS

| 5,204,633 A * | 4/1993 | Ahladas ............. G01R 31/3278 324/207.16 |
| 7,654,009 B2 | 2/2010 | Ishii et al. |
| 8,727,880 B2 * | 5/2014 | Rebmann ............. G01D 5/2086 463/36 |

FOREIGN PATENT DOCUMENTS

| DE | 12 96 395 | 5/1969 |
| GB | 2 089 515 | 6/1982 |

OTHER PUBLICATIONS

International Preliminary Report on Patentability, dated Dec. 16, 2014, issued in corresponding International Application No. PCT/EP2013/001403.
International Search Report, dated Feb. 26, 2014, issued in corresponding International Application No. PCT/EP2013/001403.

* cited by examiner

*Primary Examiner* — Hoai-An D Nguyen
(74) *Attorney, Agent, or Firm* — Kenyon & Kenyon LLP

(57) ABSTRACT

A method for determining the position of a mobile unit which has a first coil, the mobile unit being disposed in a manner allowing movement relative to a stationary second coil, and a system for carrying out a method, the first coil having two part-windings, the second coil likewise having two part-windings, prevailing strengths of the inductive coupling of the part-windings of the first coil, or of the first coil to the part-windings of the second coil or to the second coil being determined, a phase shift of the induced AC-voltage signals being determined, a position range in which the phase shift is a biunique function of the position being determined from the coupling strengths, the position being determined from the phase shift.

17 Claims, 6 Drawing Sheets

| Transmitter | Y | Y | X | X | X+Y | X+Y | X+Y |
|---|---|---|---|---|---|---|---|
| Receiver | A | B | A | B | A | B | A+B |

Fig.2

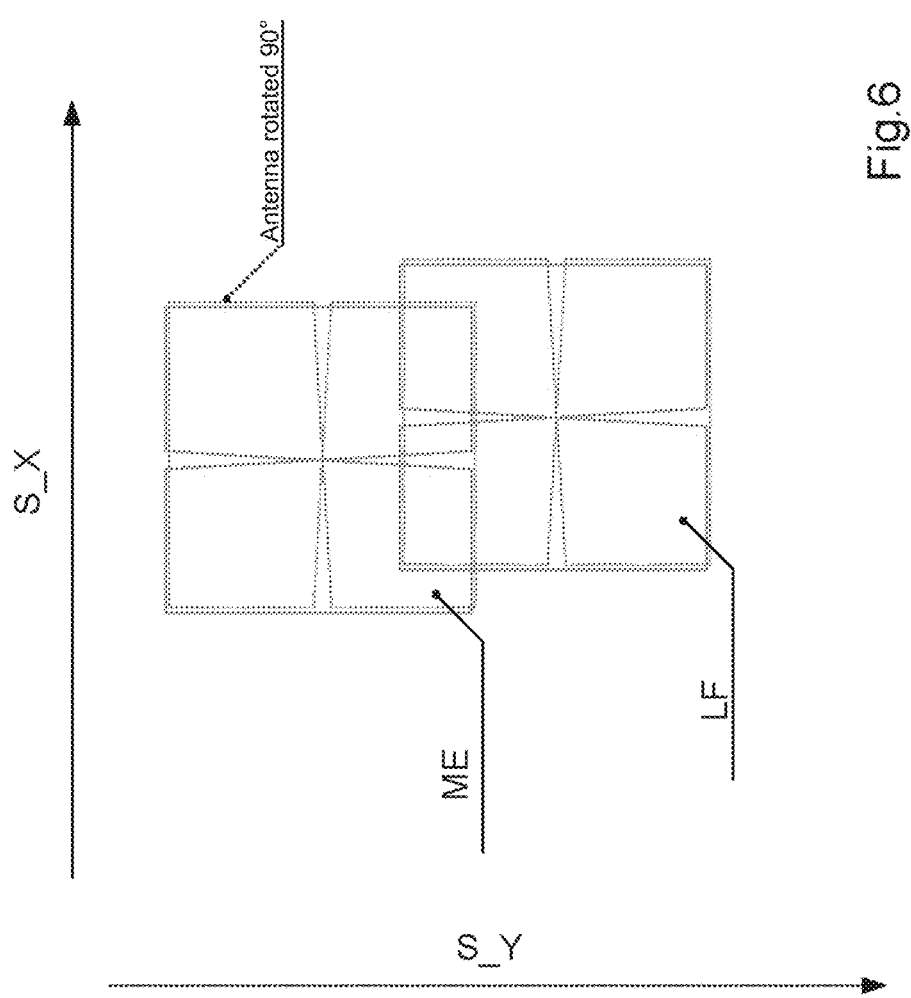

METHOD FOR DETERMINING THE POSITION OF A MOBILE UNIT AND INSTALLATION FOR EXECUTING A METHOD

FIELD OF THE INVENTION

The present invention relates to a method for determining the position of a mobile unit and a system for carrying out a method.

BACKGROUND INFORMATION

It is generally known that a winding supplied with alternating current brings about an induced voltage in another winding, the inductive coupling decreasing with increasing distance between the coils.

SUMMARY

Therefore, the object of the present invention is to further develop a method for determining the position of a mobile unit.

Important features of the invention with regard to the method for determining a position coordinate of a mobile unit are that the unit has a first coil, the mobile unit being disposed in a manner allowing movement relative to a stationary second coil, the first coil having two part-windings, the second coil likewise having two part-windings, prevailing strengths of the inductive coupling of one respective part-winding of the first coil, or of the first coil to a respective part-winding of the second coil or to the second coil being determined, a phase shift of the induced AC-voltage signals being determined, a position range in which the phase shift is a biunique function of the position being determined from the coupling strengths, the position being determined from the phase shift.

The advantage in this context is that the inductive coupling of two coils is used to determine the relative position. In so doing, however, not just one inductive coupling is determined, but rather a plurality of inductive couplings which are assigned to the respective part-windings of the coils. Thus, the coils have a considerable spatial extension. The reason is that the part-windings of each coil are set apart from each other. Therefore, different distances of the inductive transmission are assigned to the various couplings, the sequence of measurements resulting in a pattern, thus, a sequence of coupling strengths. Because the specific distances underlying the respective measurement are different, a position range is determinable by this pattern of couplings. The features of the pattern are reducible to the mere relations of the coupling strengths to one another. Thus, in the case of the signal evaluation, it is even sufficient to check only whether a particular coupling strength is greater than another or not.

Consequently, a distance, particularly a position coordinate, is thus determinable. For a complete position determination within one plane, it is necessary to determine two position coordinates. To that end, the above-named method including determination of a pattern of coupling strengths is thus also carried out in a second configuration which is superpositioned relative to the first in independent manner. For that, the identical coil configuration is again used, in doing which, however, it being disposed perpendicular to, thus rotated by 90°, relative to the coil configuration indicated above. Therefore, the two systems work in a manner uninfluenced by each other, thus permitting the determination of the second position coordinate.

In one advantageous development, the dependence of the phase shift on the position is stored as a table in a memory, in particular, table values being interpolated when determining the position from the phase shift ascertained. The advantage in so doing is that a position is determinable in an easy and biunique manner. The reason is that within the position range determined with the aid of the pattern recognition used on the pattern formed by the respective coupling strengths, a biunique assignable position is able to be discovered for each phase shift determined.

In one advantageous refinement, the part-windings of the first coil are set apart from each other, and the part-windings of the second coil are likewise set apart from each other. This is advantageous because it permits a distance determination, in doing which, the inductive coupling strengths ascertained being evaluated.

In one advantageous embodiment, the part-windings each encompass the same area amount. The advantage in this case is that the coupling strengths and their comparison are determinable in easy manner from the induced voltage amounts. The reason is that owing to the similar realization of all the part-windings and due to the parallel layout, especially in the same plane, the prevailing induced voltage amount is a measure for the respective inductive coupling.

In one advantageous development, the part-windings have opposite winding directions, in particular, in response to a homogeneous alternating magnetic field, the same amount of induced voltage occurring in the part-windings of each of the coils, and the voltage induced in a first part-winding of the respective coil having an opposite sign relative to the voltage induced in the other part-winding of the respective coil. The advantage in this context is that the voltage amount is unambiguously characteristic for the specific coupling strength.

In one advantageous refinement, the phase difference between the phase of an AC voltage induced in response to the coupling of a single part-winding of the first coil to a single part-winding of the second coil and the phase of the AC voltage induced in response to the coupling of the series connection of the part-windings of the first coil to the series connection of the part-windings of the second coil is used as phase shift. This offers the advantage that the part-windings of the first coil are able to be supplied with current one after another, and in the same way, the voltages induced in the part-windings of the second coil, especially also individually and after that together, are detectable one after another. In this manner, the phase shift between two such measurements is also detectable. Advantageously, In measuring the induced voltages at the first coil operated as primary coil, alternating current is applied to the respective part-windings in succession with the aid of a switch configuration controllable by a switching sequence. The controllable switch configuration of the second coil operated as secondary coil is acted upon with another switching sequence, so that the voltages induced in the corresponding part-windings are determined one after the other. With the aid of these switching sequences, a pattern, thus, a time sequence of coupling strengths is then determined.

At the same time, however, the phase relation of the voltage induced in response to a specific switching state of the switches of the two switch configurations is also detectable. The resulting phase shift of the induced voltages within the pattern is thus determinable without special additional expenditure.

In one advantageous embodiment, the position is determined along a straight line, from which the second coil and/or the center of mass of the second coil is set apart. The advantage in this case is that the first position coordinate is thus determinable in an easy manner, and an orthogonal rectilinear coordinate system is usable as coordinate system.

In one advantageous refinement, to determine the two-dimensional position coordinates, the mobile unit has a further coil which is disposed perpendicular to, especially rotated by 90°, relative to the first coil, and another likewise stationary coil is provided, which is perpendicular to, especially rotated by 90°, relative to the second coil, in particular, the AC voltages fed into the coils having the same frequency. This is advantageous because a superpositioned system is usable, thus a system able to be superimposed in a manner free of interference is operable at the same frequency. To that end, the further coil configuration necessary for determining the second position coordinate may be realized identically, but being rotated by 90° within the plane, thus having an axis of rotation parallel to the direction of surface normal of the plane. In this context, the coils are all oriented in parallel, and thus their vertical projections into a plane containing at least one of the coils are equal, but not overlapping.

In one advantageous embodiment, the coupling strengths determined form a pattern whose features are compared to corresponding features of a pattern characteristic for a specific position range, in particular, the features being relations of one detected coupling strength to another coupling strength detected in each case. This is advantageous because a comparison of the peak values or the effective values is sufficient to determine the features characteristic for the specific position range.

In one advantageous embodiment, the position ranges are two-dimensional area sections. In particular, the position is characterized by two position coordinates of an orthogonal coordinate system. This is advantageous because it permits a two-dimensional position determination.

In one advantageous development, the position is determined in a plane whose direction of surface normal is parallel to the axial winding direction of the part-windings. This offers the advantage of permitting a simple position determination.

In one advantageous refinement, the part-windings are flat windings, especially essentially planar windings. This is advantageous because easily producible windings are used.

Important features with regard to the system for carrying out an above-mentioned method are that the second coil is situated on the bottom or in the bottom of the system, and the first coil is located on a mobile unit.

This is advantageous because the invention may be realized using easily producible means. In addition, the system is usable for carrying out the method in the inductive power-transfer range.

In one advantageous embodiment, the first coil is connected to a controllable switch configuration in such a way that each of the part-windings is able to be supplied with current separately or the series connection of part-windings is able to be supplied with current as a function of the switch position, and/or the second coil is connected to a controllable switch configuration in such a way that the AC voltage induced in each of the part-windings or the AC voltage induced in the series connection of part-windings is able to be supplied to a measuring amplifier and/or an evaluation unit as a function of the switch position.

The advantage in this case is that owing to the separate energizing following one another in time, a sequence of coupling strengths is obtained over time, thus, a pattern. The position range is then clearly recognizable by the characteristic features of the pattern.

BRIEF DESCRIPTION OF THE DRAWINGS

FIG. 2 shows an associated measuring sequence.

FIG. 6 shows a corresponding configuration for determining the two-dimensional offset.

DETAILED DESCRIPTION

Figure 1:
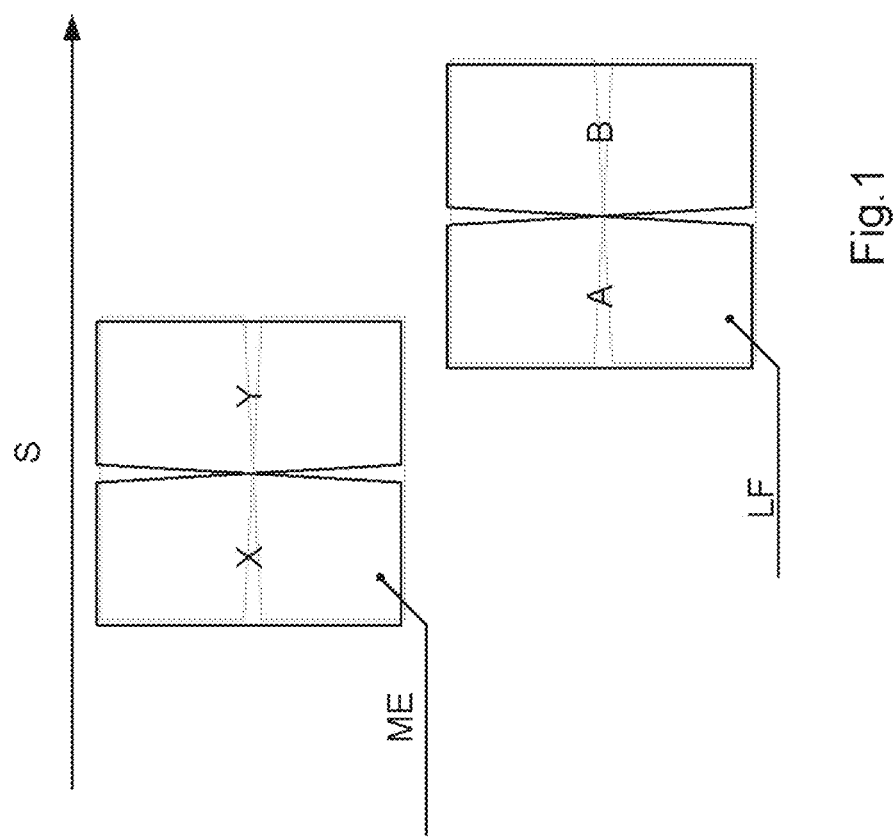
FIG. 1 shows a schematic view of the configuration according to the present invention, in which two similarly constructed coils have a spatial offset relative to each other.

As shown in FIG. 1, a first coil having part-windings A and B is disposed so as to be offset relative to a second, similarly constructed coil having part-windings X and Y, which is located on a mobile unit.

The second coil is disposed in a manner allowing movement in the direction indicated by the direction of the arrow. The position along this direction is designated by S. Perpendicular to this direction, a non-vanishing offset is likewise present between the coils.

In FIG. 1, the first and second coils are shown projecting into the same plane. To determine the offset of the first relative to the second coil in the projection plane shown in FIG. 1, the inductive coupling strengths between part-windings of the first and second coil are determined.

To that end, the first coil has a center tap and the second coil likewise has a center tap. The two part-windings (A, B) of the first coil are therefore operable separately—on one hand for transmitting and on the other hand for receiving. Part-winding A encompasses an area whose amount is equal to the amount of the area encompassed by part-winding B of the first coil. The winding directions of the two part-windings (A, B) of the first coil are opposite relative to each other. Thus, upon magnetization of the first coil with a homogeneous magnetic field, the same amount of voltage is induced at both part-windings, but the operational sign is opposite. The projections of part-windings (A, B) of the first coil into the plane shown in FIG. 1 do not overlap.

In the same way, the second coil has two part-windings (X, Y), each of which is operable separately, since a center tap is likewise implemented. Part-winding X encompasses an area whose amount is equal to the amount of the area encompassed by part-winding Y of the second coil. The winding directions of the two part-windings (X, Y) of the second coil are opposite relative to each other. Thus, upon magnetization of the second coil with a homogeneous magnetic field, the same amount of voltage is induced at both part-windings, the operational sign being opposite, however. The projections of part-windings (X, Y) of the second coil into the plane shown in FIG. 1 do not overlap.

The first coil and the second coil are now set apart in FIG. 1 in the direction of the position to be determined, and also in the direction perpendicular to it.

Figure 4:
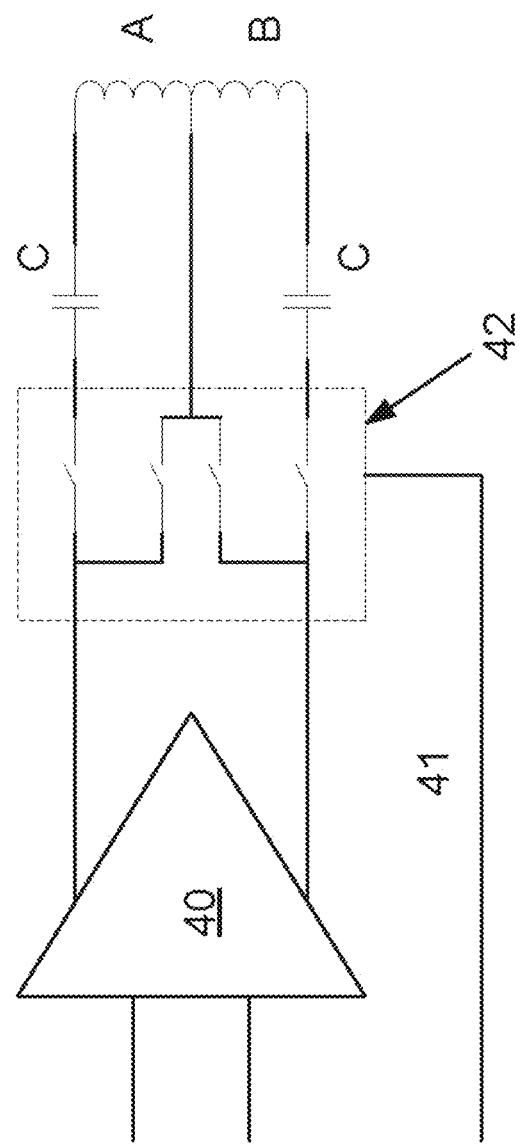
FIG. 4 shows the wiring of the coil of the transmitter of the stationary coil.

As shown in FIG. 4, for transmitting, an AC-voltage signal is conducted across an amplifier 40, whose output signal is fed to a controllable circuit configuration 42, whose switches are controllable via control-signal lines 41. Thus, depending upon the switch position, the amplified AC-voltage signal may be supplied either to first part-winding A or to part-winding B, or perhaps, with non-energizing of the center tap of the first coil, to both part-windings (A+B) as series connection. In analogous manner, the second coil is connected to a controllable switch configuration, so that the voltages induced in part-windings X and Y are able to be supplied separately to an amplifier, or perhaps the voltage induced jointly in the series connection of part-windings X and Y is able to be supplied to an amplifier.

As shown in FIG. 2, various couplings are determined in this manner, namely, part-winding Y to part-winding A, then part-winding Y to part-winding B, then part-winding X to part-winding A, then part-winding X to part-winding B, then the series connection of part-windings X and Y to part-winding A, then the series connection of part-windings X and Y to part-winding B, then the series connection of part-windings X and Y to the series connection of part-windings A and B.

Figure 3:
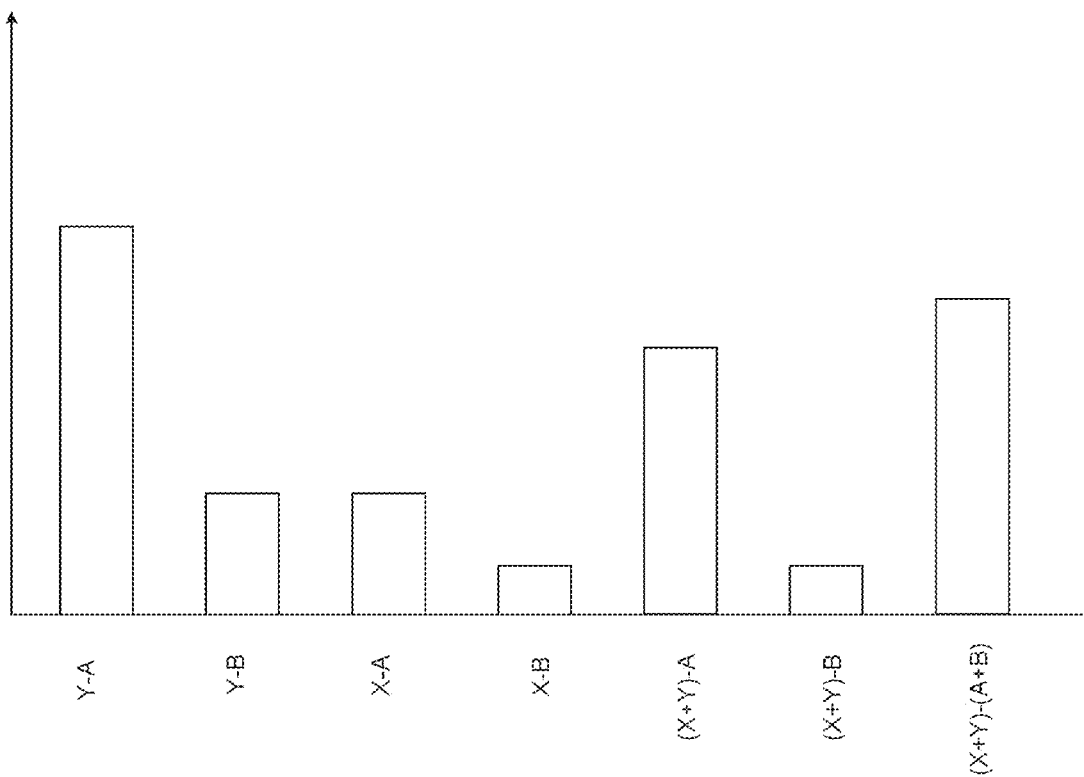
FIG. 3 shows schematically the measured values belonging to the measuring sequence according to FIG. 2.

The coupling strengths detected for the eight couplings indicated are illustrated qualitatively in FIG. 3. The relations of the coupling strengths are relevant in this connection. Altogether, the coupling strengths form a pattern which characterizes a specific distance range, thus, position range S. For example, if the first and second coil cover the same position range, the coupling strength of A to X equals the coupling strength of B to Y.

Therefore, from the pattern recognition of the pattern of coupling strengths ascertained in each case, a position range is thus determinable which includes position S of the mobile unit.

Figure 5:
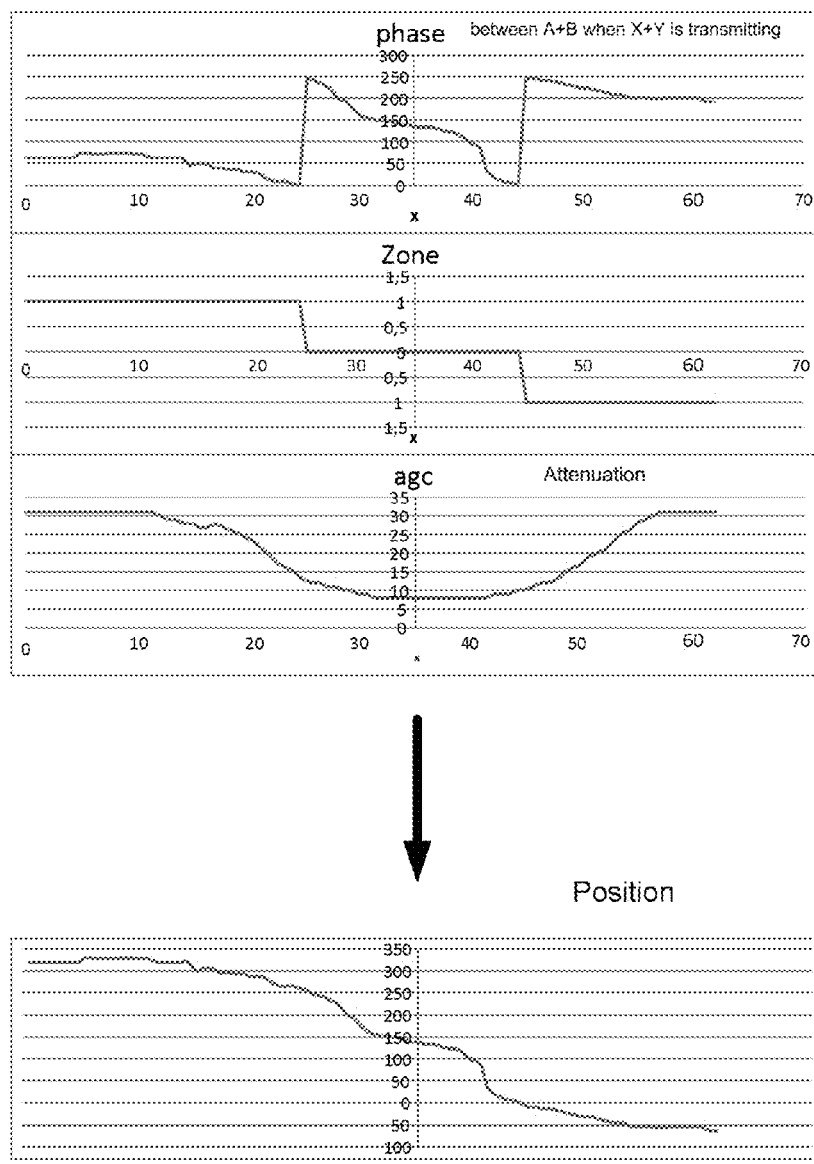
FIG. 5 shows the characteristic of the phase between the part-windings of the coil.

In addition, as shown in FIG. 5, upon transmitting an AC-voltage signal via the series connection made up of part-winding X and part-winding Y, the voltage induced in the series connection of part-windings A and B has a phase shift, thus phase, compared with the AC-voltage signal transmitted, which is illustrated by way of example as a function of position S in FIG. 5. In this instance, the characteristic of the phase is shown in the upper part of FIG. 5. The phase In this case is a biunique function of position S only within one specific position range.

However, since a position range was determined via the pattern recognition, position S of the mobile unit is able to be determined unambiguously from the specific phase ascertained.

FIG. 5 also shows the position ranges, thus zones, in which a biunique determination of the position from the phase is made possible The position ranges are in turn different depending on the distance of the mobile unit in the direction perpendicular to the direction of movement.

As shown in FIG. 6, not only is a one-dimensional position S, thus S_X, determinable, but also the two-dimensional position (S_X, S_Y), by assigning to each of the two coils an identical coil rotated by 90°, thus, a first stationary and a second on the mobile unit. The couplings of the part-windings of these coils—rotated by 90°—to each other are also determined, and the phase shift upon inductive coupling of the series connections of the part-windings. Thus, position S_Y, measured in a direction perpendicular to first position direction S_X, is also determinable.

The pattern of the coupling strengths determined changes in response to movement of the mobile unit in the direction of position S.

LIST OF REFERENCE SYMBOLS

X first part-winding of the coil of the mobile unit
Y second part-winding of the coil of the mobile unit
A first part-winding of the stationary coil
B second part-winding of the stationary coil
C capacitor
K coupling
agc attenuation
S position
S_X abscissa position
S_Y ordinate position
40 amplifier
41 control-signal line
42 controllable switch configuration

What is claimed is:

1. A method for determining a position coordinate of a mobile unit which has a first coil, the mobile unit being disposed in a manner allowing movement relative to a stationary second coil, the first coil having two part-windings, the second coil likewise having two part-windings, the method comprising:
   determining prevailing strengths of an inductive coupling of one respective part-winding of the first coil, or of the first coil to a respective part-winding of the second coil or to the second coil;
   determining a phase shift of induced AC-voltage signals;
   determining a position range in which the phase shift is a biunique function of the position from the coupling strengths; and
   determining the position coordinate from the phase shift.

2. The method as recited in claim 1, further comprising:
   storing a dependency of the phase shift on the position coordinate as a table in a memory.

3. The method as recited in claim 2, wherein table values are interpolated when determining the position from the phase shift.

4. The method as recited in claim 1, wherein the part-windings of the first coil are set apart from each other, and the part-windings of the second coil are likewise set apart from each other.

5. The method as recited in claim 1, wherein the part-windings in each case encompass the same area amount.

6. The method as recited in claim 1, wherein the position coordinate is determined along a straight line, from which at least one of the second coil and a center of mass of the second coil is set apart.

7. The method as recited in claim 1, wherein the position ranges are two-dimensional area sections.

8. The method as recited in claim 1, wherein the position coordinate is characterized by two position coordinates of an orthogonal coordinate system.

9. The method as recited in claim 1, wherein the position is determined in a plane whose direction of surface normal is parallel to an axial winding direction of the part-windings.

10. The method as recited in claim 1, wherein the part-windings are flat windings.

11. The method as recited in claim 10, wherein the flat windings are planar windings.

12. A method for determining a position coordinate of a mobile unit which has a first coil, the mobile unit being disposed in a manner allowing movement relative to a stationary second coil, the first coil having two part-windings, the second coil likewise having two part-windings, the method comprising:

determining prevailing strengths of an inductive coupling of one respective part-winding of the first coil, or of the first coil to a respective part-winding of the second coil or to the second coil;

determining a phase shift of induced AC-voltage signals;

determining a position range in which the phase shift is a biunique function of the position from the coupling strengths; and determining the position coordinate from the phase shift;

wherein to determine two-dimensional position coordinates, the mobile unit has a further coil which is disposed perpendicular to, relative to the first coil, and another likewise stationary coil is provided, which is disposed perpendicular to relative to the second coil.

13. The method as recited in claim 12, wherein AC voltages fed into the coils have the same frequency.

14. A method for determining a position coordinate of a mobile unit which has a first coil, the mobile unit being disposed in a manner allowing movement relative to a stationary second coil, the first coil having two part-windings, the second coil likewise having two part-windings, the method comprising:

determining prevailing strengths of an inductive coupling of one respective part-winding of the first coil, or of the first coil to a respective part-winding of the second coil or to the second coil;

determining a phase shift of induced AC-voltage signals;

determining a position range in which the phase shift is a biunique function of the position from the coupling strengths; and determining the position coordinate from the phase shift;

wherein the coupling strengths determined form a pattern, features of the pattern being compared to corresponding features of a pattern characteristic for a specific position range.

15. The method as recited in claim 14, the features being relations of one detected coupling strength to another coupling strength detected in each case.

16. A method for determining a position coordinate of a mobile unit which has a first coil, the mobile unit being disposed in a manner allowing movement relative to a stationary second coil, the first coil having two part-windings, the second coil likewise having two part-windings, the method comprising:

determining prevailing strengths of an inductive coupling of one respective part-winding of the first coil, or of the first coil to a respective part-winding of the second coil or to the second coil;

determining a phase shift of induced AC-voltage signals;

determining a position range in which the phase shift is a biunique function of the position from the coupling strengths; and determining the position coordinate from the phase shift;

wherein the part-windings have opposite winding directions, wherein, in response to a homogeneous alternating magnetic field, the same amount of induced voltage occurring in the part-windings of each of the coils, and the voltage induced in a first part-winding of the respective coil having an opposite sign relative to the voltage induced in the other part-winding of the respective coil.

17. A method for determining a position coordinate of a mobile unit which has a first coil, the mobile unit being disposed in a manner allowing movement relative to a stationary second coil, the first coil having two part-windings, the second coil likewise having two part-windings, the method comprising:

determining prevailing strengths of an inductive coupling of one respective part-winding of the first coil, or of the first coil to a respective part-winding of the second coil or to the second coil;

determining a phase shift of induced AC-voltage signals;

determining a position range in which the phase shift is a biunique function of the position from the coupling strengths; and determining the position coordinate from the phase shift;

wherein the phase difference between:

a phase of an AC voltage induced in response to the coupling of a single part-winding of the first coil to a single part-winding of the second coil, and and a phase of the AC voltage induced in response to the coupling of the series connection of the part-windings of the first coil to the series connection of the part-windings of the second coil is used as the phase shift.

\* \* \* \* \*